United States Patent
Kuk et al.

(10) Patent No.: US 10,692,440 B2
(45) Date of Patent: Jun. 23, 2020

(54) PIXEL AND ORGANIC LIGHT EMITTING DISPLAY DEVICE INCLUDING THE SAME

(71) Applicant: SAMSUNG ELECTRONICS CO., LTD., Suwon-si, Gyeonggi-do (KR)

(72) Inventors: Seung Hee Kuk, Hwaseong-si (KR); Si Woo Kim, Suwon-si (KR); Won Seok Kim, Seongnam-si (KR); Jung Moon Kim, Seoul (KR); Yeong Shin Jang, Osan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/251,781

(22) Filed: Jan. 18, 2019

(65) Prior Publication Data
US 2019/0392765 A1 Dec. 26, 2019

(30) Foreign Application Priority Data
Jun. 20, 2018 (KR) .......................... 10-2018-0071086

(51) Int. Cl.
*G09G 3/30* (2006.01)
*G09G 3/3266* (2016.01)
(Continued)

(52) U.S. Cl.
CPC ......... *G09G 3/3266* (2013.01); *G09G 3/3233* (2013.01); *G09G 3/3291* (2013.01);
(Continued)

(58) Field of Classification Search
CPC ... G09G 2300/0408; G09G 2300/0426; G09G 2300/0439; G09G 2300/0809;
(Continued)

(56) References Cited

U.S. PATENT DOCUMENTS 8,477,085 B2   7/2013   Shishido
9,129,927 B2   9/2015   Gupta et al.
(Continued)

FOREIGN PATENT DOCUMENTS

KR   10-2015-0100516 A   9/2015
KR   10-2016-0018825 A   2/2016
(Continued)

OTHER PUBLICATIONS

USPTO Office action dated Mar. 20, 2020 for copending U.S. Appl. No. 16/243,609.

*Primary Examiner* — Insa Sadio
(74) *Attorney, Agent, or Firm* — Lee IP Law, P.C.

(57) ABSTRACT

A pixel includes an organic light emitting diode (OLED), a first transistor connected to a driver and a first node, having a gate connected to a control line, a second transistor between to the first node and a second node, having a gate connected to a third node, a third transistor connected to an anode of the OLED, having a gate connected to the control line, a fourth transistor between the first node and a data line, having a gate connected to a scan line, a fifth transistor between the second and third nodes, having a gate connected to the scan line, a sixth transistor between an initializing line and the anode, having a gate connected to the scan line, a seventh transistor between the initializing line and the third node, having a gate connected to another scan line, and a storage capacitor between the driver and the third node.

10 Claims, 5 Drawing Sheets

(51) Int. Cl.

| | | |
|---|---|---|
| *G09G 3/3233* | (2016.01) | |
| *H01L 27/12* | (2006.01) | |
| *H01L 27/32* | (2006.01) | |
| *G09G 3/3291* | (2016.01) | |
| *H01L 29/786* | (2006.01) | |

(52) U.S. Cl.
CPC ........ *H01L 27/124* (2013.01); *H01L 27/1225* (2013.01); *H01L 27/3262* (2013.01); *H01L 27/3265* (2013.01); *H01L 27/3276* (2013.01); *G09G 2300/0408* (2013.01); *G09G 2300/0426* (2013.01); *G09G 2300/0439* (2013.01); *G09G 2300/0809* (2013.01); *G09G 2330/021* (2013.01); *H01L 29/7869* (2013.01); *H01L 29/78672* (2013.01)

(58) Field of Classification Search
CPC ........... G09G 2330/021; G09G 3/3233; G09G 3/3266; G09G 3/3291; H01L 27/1225; H01L 27/124; H01L 27/3262; H01L 27/3265; H01L 27/3276; H01L 29/78672; H01L 29/7869

See application file for complete search history.

(56) References Cited

U.S. PATENT DOCUMENTS

| | | | |
|---|---|---|---|
| 9,276,050 | B2 | 3/2016 | Kwon et al. |
| 9,412,799 | B2 | 8/2016 | Chang et al. |
| 9,564,478 | B2 | 2/2017 | Chang et al. |
| 9,627,462 | B2 | 4/2017 | Kwon et al. |
| 9,634,038 | B2 | 4/2017 | Kwon et al. |
| 9,818,765 | B2 | 11/2017 | Osawa et al. |
| 2012/0001893 | A1* | 1/2012 | Jeong .................. G09G 3/3233 345/213 |
| 2012/0162177 | A1 | 6/2012 | Lee |
| 2012/0235965 | A1 | 9/2012 | Pai |
| 2013/0222356 | A1* | 8/2013 | Jeong .................. G09G 3/3233 345/211 |
| 2015/0055047 | A1 | 2/2015 | Chang |
| 2015/0243220 | A1 | 8/2015 | Kim et al. |
| 2015/0364089 | A1 | 12/2015 | Pyo et al. |
| 2016/0035812 | A1 | 2/2016 | Kwon et al. |
| 2016/0063921 | A1 | 3/2016 | Tsai et al. |
| 2016/0210898 | A1 | 7/2016 | Tsuge et al. |
| 2017/0186782 | A1 | 6/2017 | Lee et al. |
| 2018/0006099 | A1 | 1/2018 | Ka et al. |

FOREIGN PATENT DOCUMENTS

| | | |
|---|---|---|
| KR | 10-2018-0004369 A | 1/2018 |
| WO | WO 2015/031037 A1 | 3/2015 |

* cited by examiner

PIXEL AND ORGANIC LIGHT EMITTING DISPLAY DEVICE INCLUDING THE SAME

CROSS-REFERENCE TO RELATED APPLICATION

Korean Patent Application No. 10-2018-0071086 filed on Jun. 20, 2018 in the Korean Intellectual Property Office, and entitled: "Pixel and Organic Light Emitting Display Device Comprising the Same," is incorporated by reference herein in its entirety.

BACKGROUND

1. Field

Embodiments relate to a pixel and an organic light emitting device including the same.

2. Description of the Related Art

An organic light emitting device displays an image using an organic light emitting diode (OLED) generating light by the recombination of electrons and holes. Such an organic light emitting device is advantageous, in that the organic light emitting device has a fast response speed while being driven with low power consumption.

The organic light emitting device has a plurality of pixels connected to a plurality of data lines and a plurality of scan lines. Each pixel includes an organic light emitting diode and a driving transistor for controlling an amount of current flowing to an organic light emitting diode.

SUMMARY

According to an aspect, a pixel includes: an organic light emitting diode; a first transistor including a first electrode connected to a first driving power, a second electrode connected to a first node, and a gate electrode connected to an emission control line; a second transistor connected between the first node and the second node, and having a gate electrode is connected to a third node; a third transistor connected between the second node and an anode electrode of the organic light emitting diode, and having a gate electrode connected to the emission control line; a fourth transistor connected between the first node and a data line, and having a gate electrode connected to a first scan line; a fifth transistor connected between the second node and the third node, and having a gate electrode is connected to the first scan line; a sixth transistor connected between an initializing power line and the anode electrode of the organic light emitting diode, and having a gate electrode connected to the first scan line; a seventh transistor having a first electrode connected to the initializing power line, a second electrode connected to the third node, and a gate electrode connected to a second scan line; and a storage capacitor connected between the first driving power and the third node.

According to an aspect, an organic light emitting device includes: an organic light emitting display panel including a plurality of data lines, a plurality of scan lines, and a plurality of pixels; a data driving unit supplying a data voltage to the plurality of data lines to drive the plurality of data lines; a scan driving unit sequentially supplying a scan signal to the plurality of scan lines to sequentially drive the plurality of scan lines; and a control unit supplying a control signal to the data driving unit and the scan driving unit to control the data driving unit and the scan driving unit, wherein each of the plurality of pixels includes: an organic light emitting diode; a first transistor including a first electrode connected to a first driving power, a second electrode connected to a first node, and a gate electrode connected to an emission control line; a second transistor connected between the first node and the second node, and having a gate electrode connected to a third node; a third transistor connected between the second node and an anode electrode of the organic light emitting diode, and having a gate electrode connected to the emission control line; a fourth transistor connected between the first node and a data line, and having a gate electrode connected to a first scan line; a fifth transistor connected between the second node and the third node, and in which a gate electrode is connected to the first scan line; a sixth transistor connected between an initializing power line and the anode electrode of the organic light emitting diode, and having a gate electrode connected to the first scan line; a seventh transistor having a first electrode connected to the initializing power line, a second electrode connected to the third node, and a gate electrode connected to a second scan line; and a storage capacitor connected between the first driving power and the third node.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, the example embodiments of the present disclosure will be described in detail with reference to the attached drawings.

Figure 1:
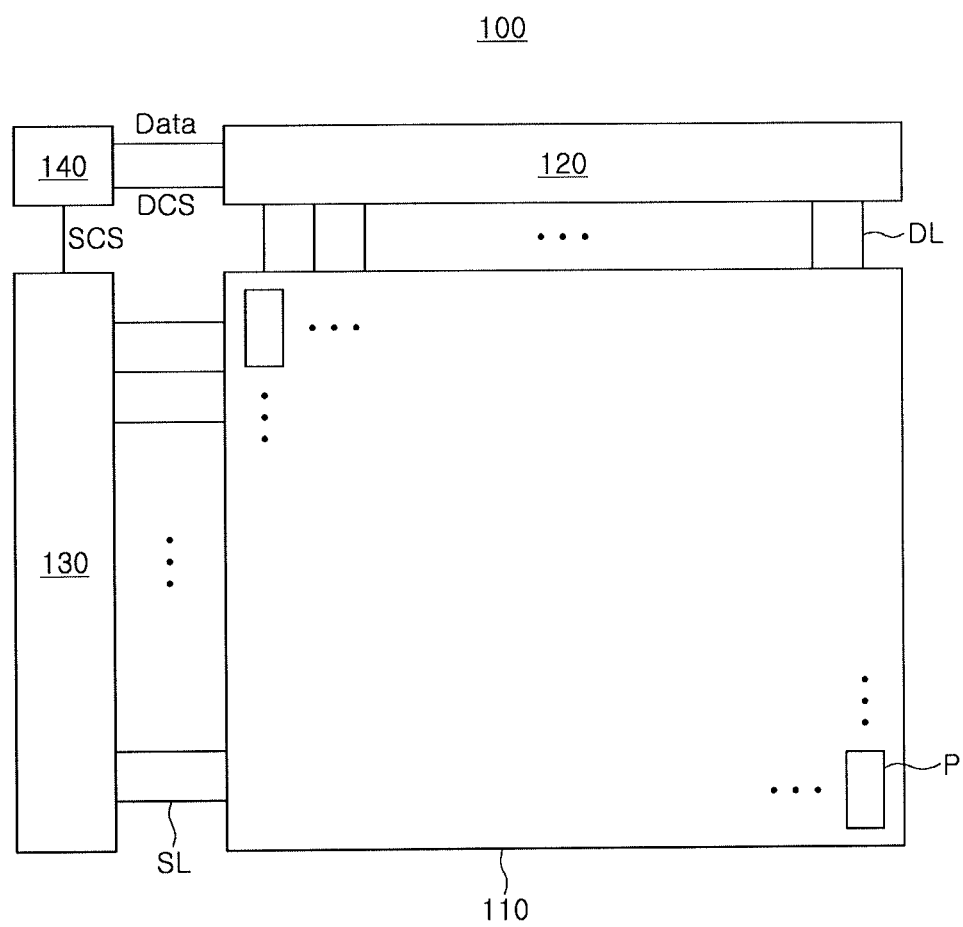
FIG. 1 illustrates a drawing of an organic light emitting device according to an example embodiment.

FIG. 1 is a drawing illustrating an organic light emitting device according to an example embodiment. Referring to FIG. 1, an organic light emitting device 100 according to an example embodiment may include an organic light emitting display panel 110, a data driving unit 120, a scan driving unit 130, and a control unit 140.

The organic light emitting display panel 110 may include a plurality of data lines DL, a plurality of scan lines SL, and a plurality of pixels P.

The plurality of pixels P may include a circuit element, e.g., a transistor, or the like. According to an example embodiment, each of the pixels P may include an organic light emitting diode (OLED), and a circuit element for driving the OLED, e.g., a driving transistor, or the like. A structure and a driving method of a pixel according to example embodiments will be described in more detail later with reference to FIGS. 2 to 5.

The data driving unit 120 may supply a data voltage to the plurality of data lines DL to drive the plurality of data lines DL. According to an example embodiment, the data driving unit 120 may include at least one source driver integrated circuit (SDIC) to drive the plurality of data lines DL.

The scan driving unit 130 may sequentially supply a scan signal to the plurality of scan lines SL to sequentially drive the plurality of scan lines SL. According to an example embodiment, the scan driving unit 130 may include at least one gate driver integrated circuit (GDIC), e.g., a Gate In Panel (GIP) type, and may be disposed in the organic light emitting display panel 110. The GIP may be implemented using a low temperature polycrystalline silicon (LTPS), and may thus have high electron mobility and fast driving characteristics.

The control unit 140 may supply a control signal to the data driving unit 120 and the scan driving unit 130, to control the data driving unit 120 and the scan driving unit 130. In detail, the control unit 140 may receive various timing signals including, e.g., a vertical synchronizing signal (Vsync), a horizontal synchronizing signal (Hsync), an input data enable (DE) signal, a clock signal (CLK), and the like, with image data, from an external source (e.g., a host system).

Moreover, the control unit 140 may generate a data driving control signal DCS and a scan driving control signal SCS in response to the timing signals which are received, may supply the data driving control signal DCS to the data driving unit 120, and may supply the scan driving control signal SCS to the scan driving unit 130. In addition, the control unit 140 may rearrange image data Data, supplied from an external source, to supply the image data Data to the data driving unit 120.

The scan driving unit 130, described above, may sequentially supply a scan signal of an On voltage or an Off voltage to the plurality of scan lines SL, according to control of the control unit 140.

The data driving unit 120 may convert the image data, received from the control unit 140, into a data voltage in analog form, and may supply the data voltage to the plurality of data lines DL, when an arbitrary scan line is driven by the scan driving unit 130.

In FIG. 1, the data driving unit 120 is illustrated as being located on one side (e.g., an upper side or a lower side) of the organic light emitting display panel 110. Alternatively, the data driving unit 120 may be located on each of both sides (e.g., an upper side and a lower side) of the organic light emitting display panel 110.

Moreover, in FIG. 1, the scan driving unit 130 is illustrated as being located on one side (e.g., a left side or a right side) of the organic light emitting display panel 110. Alternatively, the scan driving unit 130 may be located on each of both sides (e.g. a left side and a right side) of the organic light emitting display panel 110.

Figure 2:
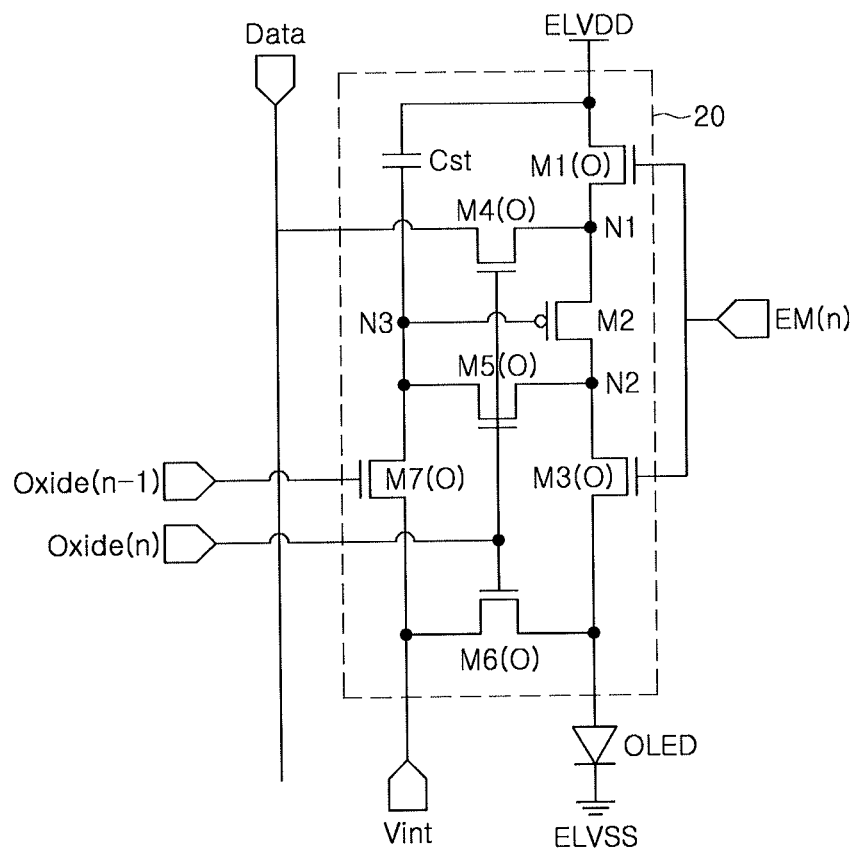
FIG. 2 illustrates a drawing of a structure of a pixel according to an example embodiment.

FIG. 2 is a drawing illustrating a structure of a pixel according to an example embodiment. Referring to FIG. 2, a pixel according to an example embodiment may include an organic light emitting diode (OLED) and a pixel circuit 20.

An anode electrode of the organic light emitting diode (OLED) is connected to the pixel circuit 20, and may generate light having a predetermined brightness corresponding to an amount of current supplied from the pixel circuit 20.

The pixel circuit 20 may control an amount of current flowing from a first driving power ELVDD via an organic light emitting diode (OLED) to a second driving power ELVSS in response to a data signal Data. Here, the pixel circuit 20 may include a first transistor M1(O) to a seventh transistor M7(O) and a storage capacitor Cst.

The first transistor M1(O) may have a first electrode connected to the first driving power ELVDD, a second electrode connected to a first node N1, and a gate electrode connected to an emission control line. Thus, the first transistor M1(O) may be turned-off when an emission control signal EM(n) is supplied and turned-on when the emission control signal EM(n) is not supplied.

A second transistor M2 is connected between a first node N1 and a second node N2. A gate electrode of the second transistor M2 is connected to a third node N3.

A third transistor M3(O) is connected between the second node N2 and an anode electrode of the organic light emitting diode (OLED). A gate electrode of the third transistor M3(O) is connected to an emission control line to be turned-off when an emission control signal EM(n) is supplied and to be turned-on when the emission control signal EM(n) is not supplied.

A fourth transistor M4(O) is connected between the first node N1 and a data line. A gate electrode of the fourth transistor M4(O) is connected to a first scan line to be turned-on when a first scan signal Oxide(n) is supplied. When the fourth transistor M4(O) is turned-on, the data line and the first node N1 are electrically connected to each other.

A fifth transistor M5(O) is connected between the second node N2 and a third node N3. A gate electrode of the fifth transistor M5(O) is connected to a first scan line to be turned-on when a first scan signal Oxide(n) is supplied. When the fifth transistor M5(O) is turned-on, the second node N2 and the third node N3 are electrically connected to each other.

A sixth transistor M6(O) is connected between an initializing power line to which an initializing power Vint is supplied and an anode electrode of the organic light emitting diode (OLED). A gate electrode of the sixth transistor M6(O) is connected to a first scan line to be turned-on when a first scan signal Oxide(n) is supplied. When the sixth transistor M6(O) is turned-on, the initializing power Vint is supplied to the anode electrode of the organic light emitting diode (OLED).

The seventh transistor M7(O) has a first electrode connected to the initializing power line, a second electrode connected to the third node N3, and a gate electrode connected to a second scan line to be turned-on when a second scan signal Oxide(n−1) is supplied. When the seventh transistor M7(O) is turned-on, the initializing power Vint is supplied to the gate electrode of the second transistor M2.

The storage capacitor Cst is connected between the first driving power ELVDD and the third node N3.

The first transistor M1(O) and the third transistor M3(O) to the seventh transistor M7(O), described above, may be provided as a P-type or N-type oxide semiconductor thin film transistor. As described above, when the first transistor M1(O) and the third transistor M3(O) to the seventh transistor M7(O) are provided as an oxide semiconductor thin film transistor, voltage fluctuations caused by a leakage current may be significantly reduced, so driving may be performed at a low scanning rate.

Meanwhile, the second transistor M2 described above may be provided as a P-type or N-type LTPS thin film transistor.

In particular, an organic light emitting device may output a high brightness with reduced power consumption by setting a driving voltage to be low or by using a low scanning rate. However, when a thin film transistor (TFT) made of low temperature polycrystalline silicon (LTPS) is used, it is difficult to drive the TFT at a low scanning rate due to a leakage current in a pixel. However, in accordance with embodiments, by using oxide semiconductor thin film transistors, the driving at a low scanning rate may be realized with a significantly reduced leakage current.

Further, previous attempts at using both LTPS transistors and oxide semiconductor thin film transistors resulted in requiring a driving unit for driving the oxide semiconductor thin film transistors and a separate driving unit for driving the LTPS transistors. In contrast, according to an example embodiment illustrated in FIG. 2, a driving unit for driving each of the oxide semiconductor thin film transistor and the LTPS thin film transistor is not required to be separately provided, so a structure of a shift register for realizing a driving unit may be simplified. For example, in addition to the scan signals Oxide(n) described above, a separate scan signal Scan(n) would be needed for driving the LTPS thin film transistor(s). In particular, by using an oxide semiconductor thin film transistor for transistors to be controlled by an emission control signal EM(n) and for the driving transistor, a driving unit for driving each of an oxide semiconductor thin film transistor and an LTPS thin film transistor is not required to be separately provided, so a structure of a shift register for implementing a driving unit may be simplified.

Figure 3:
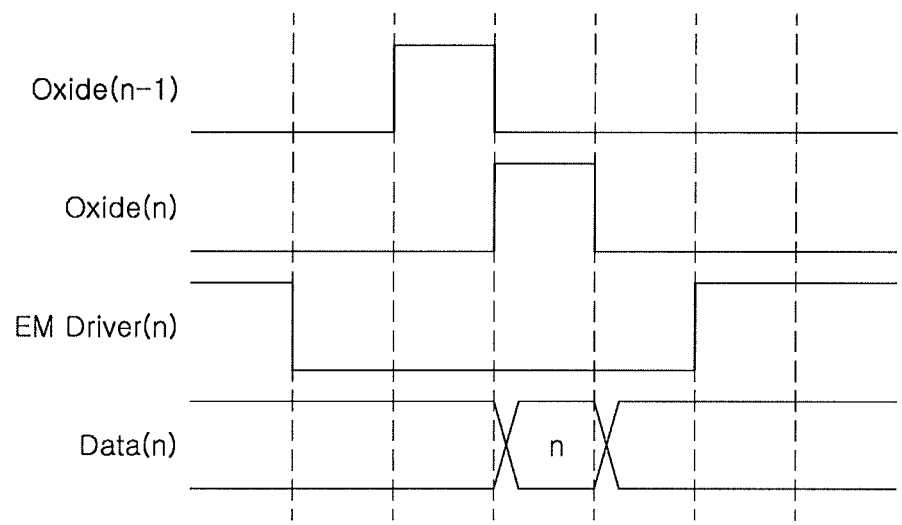
FIG. 3 illustrates a waveform diagram of an example embodiment of a driving method of the pixel illustrated in FIG. 2.

FIG. 3 is a waveform diagram illustrating an example embodiment of a driving method of the pixel illustrated in FIG. 2.

Referring to FIG. 3, first, when an emission control signal EM(n), a low voltage, is supplied to an emission control line, a first transistor M1(O) and a third transistor M3(O) are turned-off. When the first transistor M1(O) is turned-off, an electrical connection between the first driving power ELVDD and the first node N1 is blocked. When the third transistor M3(O) is turned-off, an electrical connection between the second node N2 and an organic light emitting diode (OLED) is blocked.

Thereafter, when a second scan signal Oxide(n−1), a high voltage, is supplied to a second scan line, a seventh transistor M7(O) is turned-on, so initializing power Vint is supplied to a third node N3.

Thereafter, when the first scan signal Oxide(n), a high voltage, is supplied to the first scan line, a fourth transistor M4(O), a fifth transistor M5(O), and a sixth transistor M6(O) are turned-on.

When the fourth transistor M4(O) is turned-on, the data line and the first node N1 are electrically connected to each other, so a data signal Data is supplied to the first node N1.

When the fifth transistor M5(O) is turned-on, the second node N2 and the third node N3 are electrically connected to each other, so the second transistor M2 is connected in a diode form. In this case, since the third node N3 is initialized to initializing power Vint, lower than the data signal Data, the second transistor M2 is turned-on, so the data signal Data, supplied to the first node N1, is supplied to the third node N3 via the second transistor M2. The storage capacitor Cst may store a voltage applied to the third node N3.

When the sixth transistor M6(O) is turned-on, the initializing power Vint is supplied to the anode electrode of the organic light emitting diode (OLED).

Thereafter, when supply of the emission control signal EM(n) is stopped, the first transistor M1(O) and the third transistor M3(O) are turned-on. When the first transistor M1(O) is turned-on, the first driving power ELVDD and the first node N1 are electrically connected to each other. When the third transistor M3(O) is turned-on, the second transistor M2 and an organic light emitting diode (OLED) are electrically connected to each other. In this case, the second transistor M2 controls an amount of current flowing from the first driving power ELVDD via the organic light emitting diode (OLED) to the second driving power ELVSS in response to a voltage of the third node N3.

Figure 4:
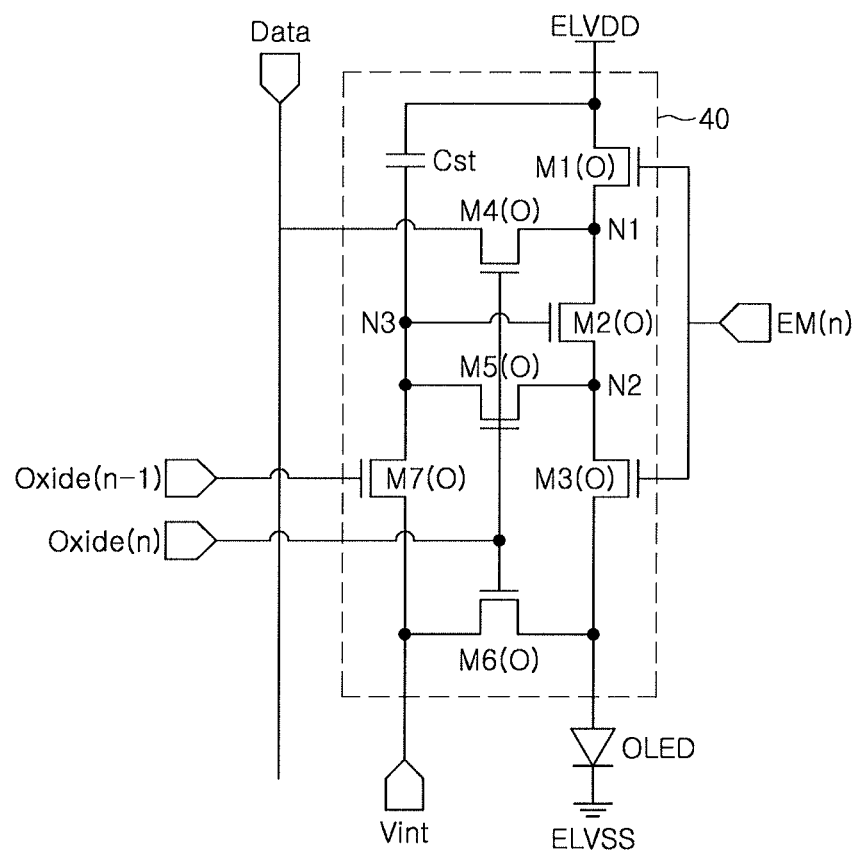
FIG. 4 illustrates a drawing of a structure of a pixel according to an example embodiment.

FIG. 4 is a drawing illustrating a structure of a pixel according to an example embodiment. Referring to FIG. 4, a pixel according to an example embodiment may include an organic light emitting diode (OLED) and a pixel circuit 40. The pixel circuit 40 illustrated in FIG. 4 has the same configuration as that of FIG. 2, but the LTPS thin film transistor M2 is replaced by an oxide semiconductor thin film transistors M2(O), such that all transistors M1(O) to M7(O) are oxide semiconductor thin film transistors.

An anode electrode of the organic light emitting diode (OLED) is connected to the pixel circuit 40, and may generate light having a predetermined brightness, corresponding to an amount of current supplied from the pixel circuit 40.

The pixel circuit 40 may control an amount of current flowing from a first driving power ELVDD via an organic light emitting diode (OLED) to a second driving power ELVSS in response to a data signal Data. Here, the pixel circuit 40 may include the first transistor M1(O) to the seventh transistor M7(O) and a storage capacitor Cst.

The first transistor M1(O) may have a first electrode connected to the first driving power ELVDD, a second electrode is connected to a first node N1, and a gate electrode of the first transistor M1(O) connected to an emission control line. Thus, the first transistor M1(O) to be turned-off when an emission control signal EM(n) is supplied and to be turned-on when the emission control signal EM(n) is not supplied.

The second transistor M2(O) is connected between a first node N1 and a second node N2. A gate electrode of the second transistor M2(O) is connected to a third node N3.

The third transistor M3(O) is connected between the second node N2 and an anode electrode of the organic light emitting diode (OLED). A gate electrode of the third transistor M3(O) is connected to an emission control line to be turned-off when an emission control signal EM(n) is supplied, and to be turned-on when the emission control signal EM(n) is not supplied.

The fourth transistor M4(O) is connected between the first node N1 and a data line. A gate electrode of the fourth transistor M4(O) is connected to a first scan line to be turned-on when a first scan signal Oxide(n) is supplied. When the fourth transistor M4(O) is turned-on, the data line and the first node N1 are electrically connected to each other.

The fifth transistor M5(O) is connected between the second node N2 and a third node N3. A gate electrode of the fifth transistor M5(O) is connected to a first scan line to be turned-on when a first scan signal Oxide(n) is supplied. When the fifth transistor M5(O) is turned-on, the second node N2 and the third node N3 are electrically connected to each other.

The sixth transistor M6(O) is connected between an initializing power line to which an initializing power Vint is supplied and an anode electrode of the organic light emitting diode (OLED). A gate electrode of the sixth transistor M6(O) is connected to a first scan line to be turned-on when a first scan signal Oxide(n) is supplied. When the sixth transistor M6(O) is turned-on, the initializing power Vint is supplied to the anode electrode of the organic light emitting diode (OLED).

The seventh transistor M7(O) may include a first electrode connected to the initializing power line, a second electrode connected to the third node N3. A gate electrode of the seventh transistor M7(O) is connected to a second scan line to be turned-on when a second scan signal Oxide(n−1) is supplied. When the seventh transistor M7(O) is turned-on, the initializing power Vint is supplied to the gate electrode of the second transistor M2.

The storage capacitor Cst is connected between the first driving power ELVDD and the third node N3.

The first transistor M1(O) to the seventh transistor M7(O), described above, may be provided as a P-type or N-type oxide semiconductor thin film transistor. As described above, when the first transistor M1(O) to the seventh transistor M7(O) are provided as an oxide semiconductor thin film transistor, voltage fluctuations caused by a leakage current may be significantly reduced, so driving may be performed at a low scanning rate.

According to an example embodiment illustrated in FIG. 4, a driving unit for driving each of the oxide semiconductor thin film transistor and the LTPS thin film transistor is not required to be separately provided, so a structure of a shift register for realizing a driving unit may be simplified.

Figure 5:
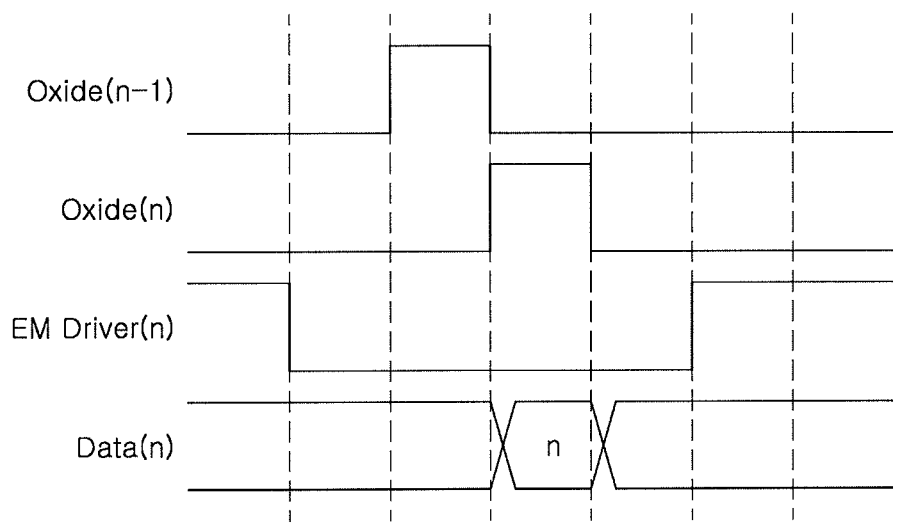
FIG. 5 illustrates a waveform diagram of an example embodiment of a driving method of the pixel illustrated in FIG. 4.

FIG. 5 is a waveform diagram illustrating an example embodiment of a driving method of the pixel illustrated in FIG. 4. The waveform diagram of FIG. 5 is the same as that of FIG. 3.

Referring to FIG. 5, first, when an emission control signal EM(n), a low voltage, is supplied to an emission control line, a first transistor M1(O) and a third transistor M3(O) are turned-off. When the first transistor M1(O) is turned-off, an electrical connection between the first driving power ELVDD and the first node N1 is blocked. When the third transistor M3(O) is turned-off, an electrical connection between the second node N2 and an organic light emitting diode (OLED) is blocked.

Thereafter, when a second scan signal Oxide(n−1), a high voltage, is supplied to a second scan line, a seventh transistor M7(O) is turned-on, so initializing power Vint is supplied to a third node N3.

Thereafter, when the first scan signal Oxide(n), a high voltage, is supplied to the first scan line, a fourth transistor M4(O), a fifth transistor M5(O), and a sixth transistor M6(O) are turned-on.

When the fourth transistor M4(O) is turned-on, the data line and the first node N1 are electrically connected to each other, so a data signal Data is supplied to the first node N1.

When the fifth transistor M5(O) is turned-on, the second node N2 and the third node N3 are electrically connected to each other, so the second transistor M2(O) is connected in a diode form. In this case, since the third node N3 is initialized to initializing power Vint, lower than the data signal Data, the second transistor M2(O) is turned-on, so the data signal Data, supplied to the first node N1, is supplied via the second transistor M2(O) to the third node N3. The storage capacitor Cst may store a voltage applied to the third node N3.

When the sixth transistor M6(O) is turned-on, the initializing power Vint is supplied to the anode electrode of the organic light emitting diode (OLED).

Thereafter, when supply of the emission control signal EM(n) is stopped, the first transistor M1(O) and the third transistor M3(O) are turned-on. When the first transistor M1(O) is turned-on, the first driving power ELVDD and the first node N1 are electrically connected to each other. When the third transistor M3(O) is turned-on, the second transistor M2(O) and an organic light emitting diode (OLED) are electrically connected to each other. In this case, the second transistor M2(O) controls an amount of current flowing from the first driving power ELVDD via the organic light emitting diode (OLED) to the second driving power ELVSS in response to a voltage of the third node N3.

As set forth above, according to example embodiments, a pixel capable of significantly reducing power consumption with a simplified driving unit and an organic light emitting device including the same are provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel, comprising:
   an organic light emitting diode;
   a first transistor having a first electrode connected to a first driving power, a second electrode connected to a first node, and a gate electrode connected to an emission control line;
   a second transistor connected between the first node and a second node, and having a gate electrode connected to a third node;
   a third transistor connected between the second node and an anode electrode of the organic light emitting diode, and having a gate electrode connected to the emission control line;
   a fourth transistor connected between the first node and a data line, and having a gate electrode connected to a first scan line;
   a fifth transistor connected between the second node and the third node, and having a gate electrode connected to the first scan line;
   a sixth transistor connected between an initializing power line and the anode electrode of the organic light emitting diode, and having a gate electrode connected to the first scan line;
   a seventh transistor having a first electrode connected to the initializing power line, a second electrode connected to the third node, and having a gate electrode connected to a second scan line; and
   a storage capacitor connected between the first driving power and the third node.

2. The pixel as claimed in claim 1, wherein the first transistor and the third transistor to the seventh transistor are formed of an oxide semiconductor thin film transistor.

3. The pixel as claimed in claim 2, wherein the second transistor is formed of a P-type low temperature polycrystalline silicon (LTPS) thin film transistor.

4. The pixel as claimed in claim 2, wherein the second transistor is formed of an N-type low temperature polycrystalline silicon (LTPS) thin film transistor.

5. The pixel as claimed in claim 1, wherein the first transistor to the seventh transistor is formed of an oxide semiconductor thin film transistor.

6. An organic light emitting device, comprising:
   an organic light emitting display panel including a plurality of data lines, a plurality of scan lines, and a plurality of pixels;
   a data driving unit supplying a data voltage to the plurality of data lines to drive the plurality of data lines;

a scan driving unit sequentially supplying a scan signal to the plurality of scan lines to sequentially drive the plurality of scan lines; and a control unit supplying a control signal to the data driving unit and the scan driving unit to control the data driving unit and the scan driving unit, wherein each of the plurality of pixels includes:
- an organic light emitting diode;
- a first transistor having a first electrode connected to a first driving power, a second electrode connected to a first node, and a gate electrode connected to an emission control line;
- a second transistor connected between the first node and a second node, and having a gate electrode connected to a third node;
- a third transistor connected between the second node and an anode electrode of the organic light emitting diode, and having a gate electrode connected to the emission control line;
- a fourth transistor connected between the first node and a data line, and having a gate electrode connected to a first scan line;
- a fifth transistor connected between the second node and the third node, and having a gate electrode connected to the first scan line;
- a sixth transistor connected between an initializing power line and the anode electrode of the organic light emitting diode, and having a gate electrode connected to the first scan line;
- a seventh transistor having a first electrode connected to the initializing power line, a second electrode connected to the third node, and a gate electrode connected to a second scan line; and
- a storage capacitor connected between the first driving power and the third node.

7. The organic light emitting device as claimed in claim 6, wherein the first transistor and the third transistor to the seventh transistor are formed of an oxide semiconductor thin film transistor.

8. The organic light emitting device as claimed in claim 7, wherein the second transistor is formed of a P-type low temperature polycrystalline silicon (LTPS) thin film transistor.

9. The organic light emitting device as claimed in claim 7, wherein the second transistor is formed of an N-type low temperature polycrystalline silicon (LTPS) thin film transistor.

10. The organic light emitting device as claimed in claim 6, wherein the first transistor to the seventh transistor are formed of an oxide semiconductor thin film transistor.

* * * * *